(12) United States Patent
Lin et al.

(10) Patent No.: US 9,787,434 B2
(45) Date of Patent: Oct. 10, 2017

(54) CYCLIC REDUNDANCY CHECK DEVICE AND METHOD

(71) Applicant: MediaTek Inc., Hsin-Chu (TW)

(72) Inventors: Chi-Feng Lin, Hsinchu (TW); Yu-Bang Nian, Changhua (TW)

(73) Assignee: MEDIATEK INC., Hsin-Chu (TW)

( * ) Notice: Subject to any disclaimer, the term of this patent is extended or adjusted under 35 U.S.C. 154(b) by 53 days.

(21) Appl. No.: 14/567,172

(22) Filed: Dec. 11, 2014

(65) Prior Publication Data

US 2016/0173230 A1    Jun. 16, 2016

(51) Int. Cl.
*H03M 13/00* (2006.01)
*H04L 1/00* (2006.01)
*H03M 13/09* (2006.01)

(52) U.S. Cl.
CPC ........ *H04L 1/0061* (2013.01); *H03M 13/091* (2013.01)

(58) Field of Classification Search
CPC .......................... H03M 13/091; G06F 11/1004
See application file for complete search history.

(56) References Cited

U.S. PATENT DOCUMENTS

| | | | | |
|---|---|---|---|---|
| 5,948,119 A * | 9/1999 | Bock | ..................... | H03M 13/09 714/752 |
| 6,560,742 B1 * | 5/2003 | Dubey | ................ | H03M 13/091 714/757 |
| 8,352,830 B2 * | 1/2013 | Landschaft | ........... | H04L 1/0045 714/752 |
| 8,578,240 B1 * | 11/2013 | Pathakota | ........... | H03M 13/091 714/758 |
| 2001/0056563 A1 * | 12/2001 | Kodama | ............. | H03M 13/091 714/758 |
| 2005/0086571 A1 * | 4/2005 | Farnsworth | ........... | H03M 13/03 714/758 |
| 2005/0097432 A1 * | 5/2005 | Obuchi | ............... | H03M 13/091 714/800 |
| 2010/0077284 A1 * | 3/2010 | Uzrad-Nali | ............. | H04L 49/90 714/807 |
| 2010/0198892 A1 * | 8/2010 | Motozuka | ........... | H03M 13/091 708/207 |
| 2014/0281844 A1 * | 9/2014 | Jiang | ................... | H03M 13/091 714/807 |

* cited by examiner

*Primary Examiner* — M. Mujtaba Chaudry
(74) *Attorney, Agent, or Firm* — McClure, Qualey & Rodack, LLP

(57) ABSTRACT

A communication device and associated method is provided. The communication device includes: a controller; a packet buffer, configured to store a current packet segment and a previous packet segment of an incoming packet; and a plurality of cyclic redundancy check (CRC) circuits, wherein each CRC circuit is individually fed with a portion of the current packet segment and/or a portion of the previous packet segment in a respective cycle of the incoming packet, and an initial value, wherein the plurality of CRC circuits are arranged in parallel.

14 Claims, 7 Drawing Sheets

CYCLIC REDUNDANCY CHECK DEVICE AND METHOD

BACKGROUND OF THE INVENTION

Field of the Invention

The invention relates to cyclic redundancy check, and more particularly to a communication device with effective cyclic redundancy check and associated method.

Description of the Related Art

Digital communication networks include communication devices that exchange digital data in the form of data units. When a data unit is transmitted (e.g., over an electrical, an optical, or a wireless connection) from one communication device to another communication device, noise and/or interference may change, degrade, or otherwise alter the data unit. Error detection techniques may be used to determine whether a data unit has been altered after being transmitted by a source communication device. One error-checking technique includes the use of a cyclic redundancy check (CRC) function. A CRC value may be computed for a data unit (e.g. a packet) and appended to the data unit prior to transmission. A receiving device may receive the data unit with the appended CRC value, compute a CRC value for the data unit, and compare the computed CRC value with the received CRC value. If the two values differ, an error may exist. However, performing an error checking computation using a CRC function may not be effective.

BRIEF SUMMARY OF THE INVENTION

A detailed description is given in the following embodiments with reference to the accompanying drawings.

A communication device is provided. The communication device includes: a controller; a packet buffer, configured to store a current packet segment and a previous packet segment of an incoming packet; and a plurality of cyclic redundancy check (CRC) circuits, wherein each CRC circuit is individually fed with a portion of the current packet segment and/or a portion of the previous packet segment in a respective transmission cycle of the incoming packet, and an initial value, wherein the plurality of CRC circuits are arranged in parallel.

A method for generating a cyclic redundancy check (CRC) value for use in a communication device is provided. The communication device comprises a plurality of CRC circuits. The method comprises the steps of: arranging the plurality of CRC circuits in parallel; and inputting each CRC circuit individually with a portion of a current packet segment and/or a portion of a previous packet segment of an incoming packet in a respective transmission cycle of the incoming packet, and an initial value.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
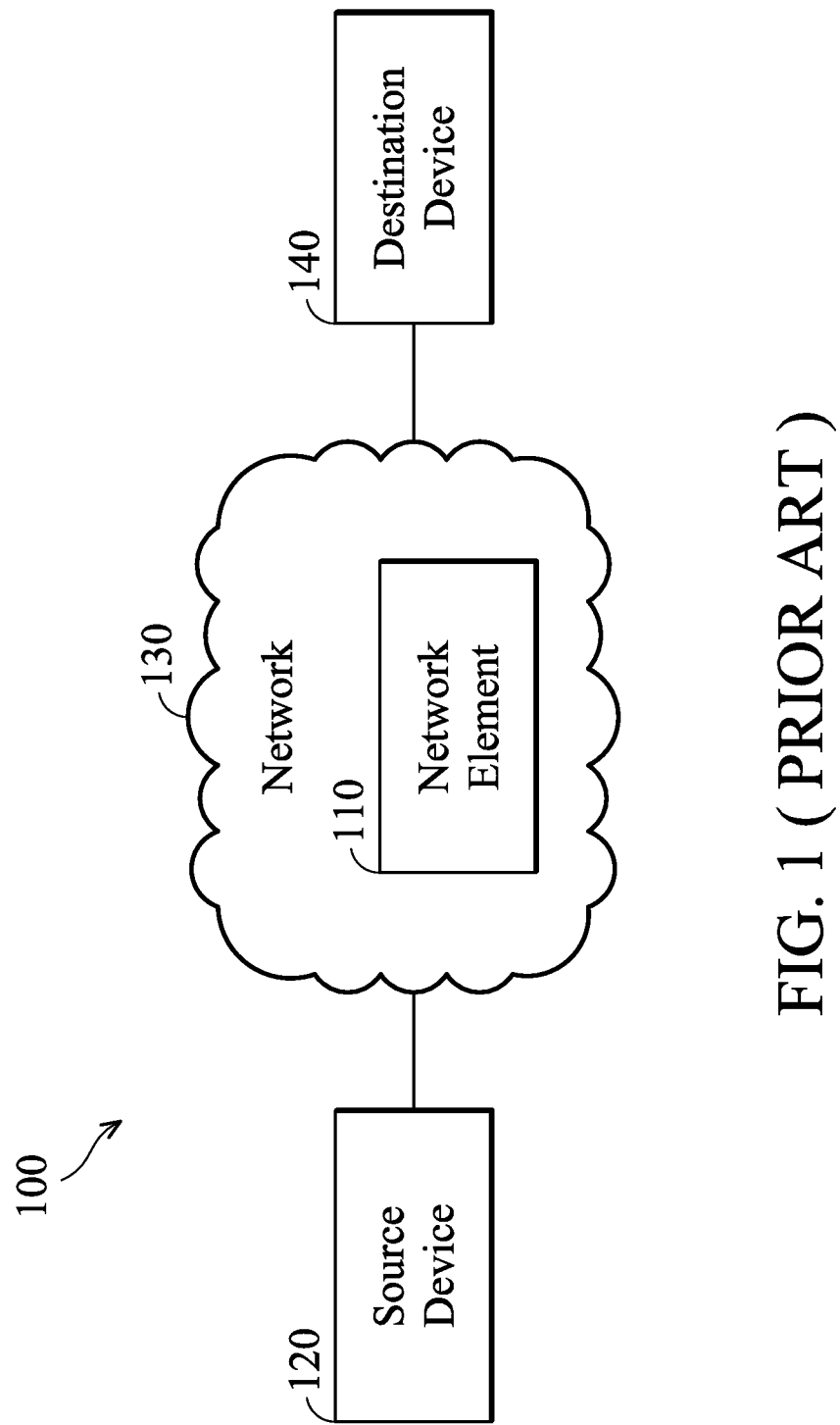
FIG. 1 is a diagram of a data transmission system in accordance with an embodiment of the invention.

FIG. 1 is a diagram of a data transmission system 100 in accordance with an embodiment of the invention. The data transmission system 100 may include one or more network elements 110 (referred to herein individually as "network element 110" and collectively as "network elements 110"), a source device 120, a network 130, and a destination device 140, where the source device 120 and the destination device 140 are communication devices which may be a transmitter and/or a receiver. The source device 120 may send packets to the destination device 140 through the network 130 via the network element 110. While a single network element 110 is illustrated in FIG. 1 for simplicity, the network 130 may include many network elements 110 and the route traveled by packets from the source device 120 to the destination device 140 may include multiple, and possibly a large number of, network elements 110.

The network element 110 may include any device that receives and transmits packets within a network or between networks. The network element 110 may include, for example, a gateway, a router, a switch, a firewall, a network interface card (NIC), a hub, a bridge, a proxy server, an optical add-drop multiplexer (OADM), and/or some other type of device (e.g., a layer 2 and/or layer 3 device) that processes and/or transfers traffic. The network element 110 may include one or more ingress interfaces and one or more egress interfaces. The network element 110 may receive a packet at one of the ingress interfaces, determine a destination for the received packet, determine an egress interface based on the determined destination, and forward the packet via the determined egress interface. Additionally, the network element 110 may determine whether to forward the received packet or whether to drop the received packet.

The source device 120 and the destination device 140 may include the same type of device or different types of devices. For example, the source device 120 and the destination device 140 may include any device with a communication function, such as a personal computer or workstation, a server device, a portable computer, a voice over Internet Protocol (VoIP) telephone device, a radiotelephone, a portable communication device (e.g. a mobile phone, a global positioning system (GPS) device, or another type of wireless device), a content recording device (e.g., a camera, a video camera, etc.), a gaming system, an access point base station, a cellular base station, and/or any type of network element.

The network 130 may include one or more types of networks. A "packet" may refer to a packet, a datagram, or a cell; a fragment of a packet, a fragment of a datagram, or a fragment of a cell; or another type, arrangement, or packaging of data. For example, network 130 may include one or more of a local area network (LAN), a wide area network (WAN), a metropolitan area network (MAN), an optical network, a cable television network, a satellite television network, a wireless network (e.g., a Code Division Multiple Access (CDMA) network, a general packet radio service (GPRS) network, and/or an LTE network), an ad hoc network, a telephone network (e.g., the Public Switched Telephone Network (PSTN) or a cellular network), an intranet, the Internet, or a combination of these networks or other types of networks.

In an embodiment, a 64-byte packet should be processed in 13 ns by the destination device 140 when a data transmission rate of 40 Gbps is used. Furthermore, the destination device 140 has to process data of 8, 16, or 24 bytes in a transmission cycle, and some complicated operations may take multiple transmission cycles. Additionally, in some applications requiring short latency, a received packet cannot be held in the destination device 140 longer than a predetermined period (e.g. 400 ns).

Figure 2:
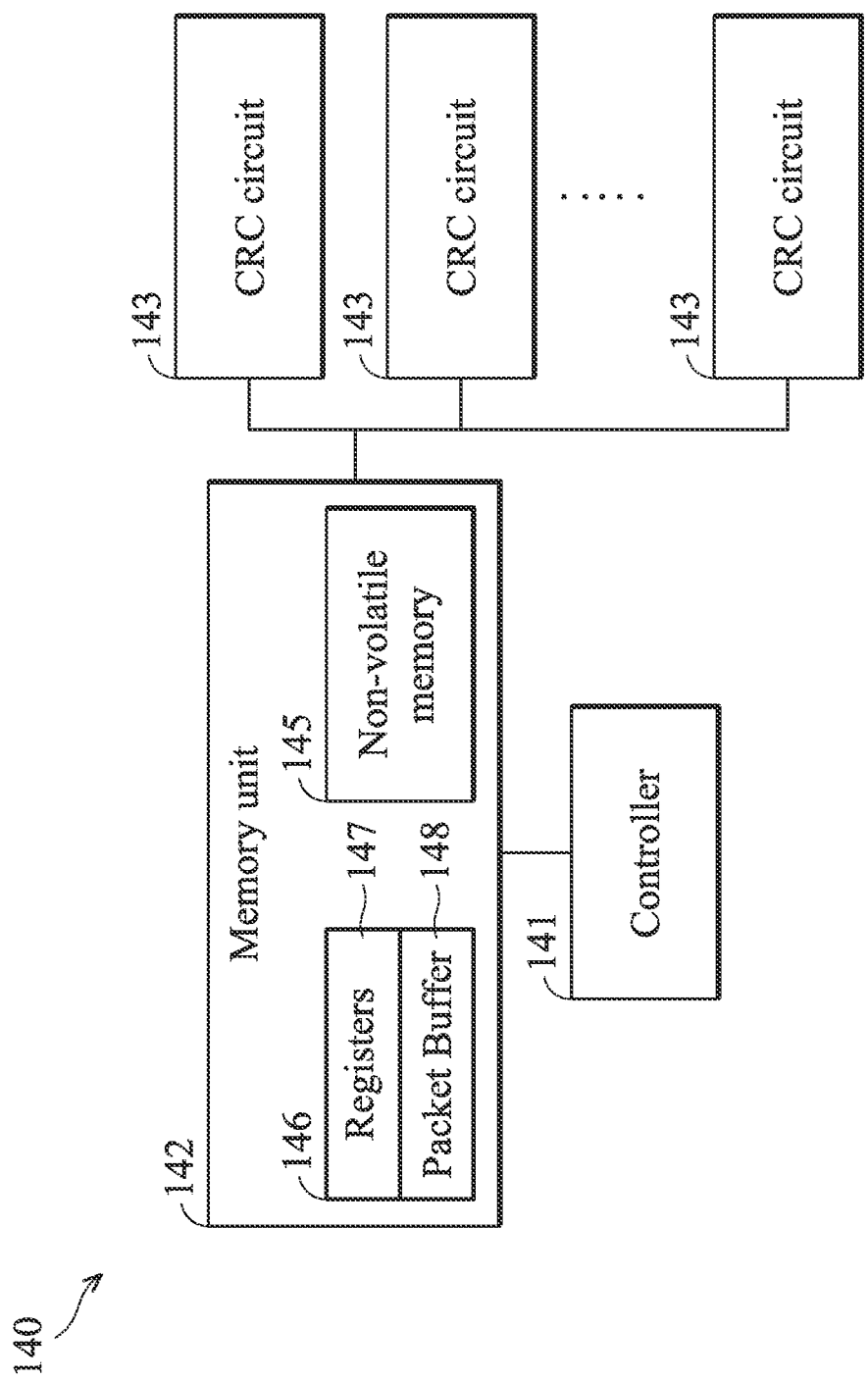
FIG. 2 is a block diagram of the destination device in accordance with an embodiment of the invention.

FIG. 2 is a block diagram of the destination device 140 in accordance with an embodiment of the invention. The destination device 140 comprises a controller 141, a memory unit 142, and a plurality of CRC circuits 143. The controller 141, for example, may be a central processing unit (CPU) or a digital signal processor (DSP), or any other equivalent circuits. The memory unit 142 may be implemented by a non-volatile memory 145 (e.g. ROM, EEPROM, etc.) and a volatile memory (e.g. registers and/or packet buffer) 146. For example, the non-volatile memory 145 records different initial values in the CRC stage. The volatile memory 146 may include registers 147 for loading the initial values for the CRC calculation. The volatile memory 146 may further include a packet buffer 148 for storing the current packet segment and previous packet segment of the incoming packet. In an embodiment, the CRC circuits 143 are configured to perform 64-bit CRC-32 calculation with fixed length, e.g. 64-bit. Taking a 64-byte incoming packet and a data path width of 64 bits as an example, the number of the CRC circuits 143 is eight. In other words, there are eight 64-bit CRC circuits 143 deployed in parallel in the destination device 140. However, each 64-bit CRC circuit 143 is fed with different input data and initial values, where the input data may be retrieved from the incoming packet (e.g. from two adjacent segments of the incoming packet) depending on the CRC phase. The controller 141 may load the initial values for the 64-bit CRC-32 calculation in different CRC phases to the volatile memory of the memory unit 142, and each 64-bit CRC-32 circuit 143 may retrieve the associated initial values from the volatile memory to perform the CRC calculation.

Figure 3A:
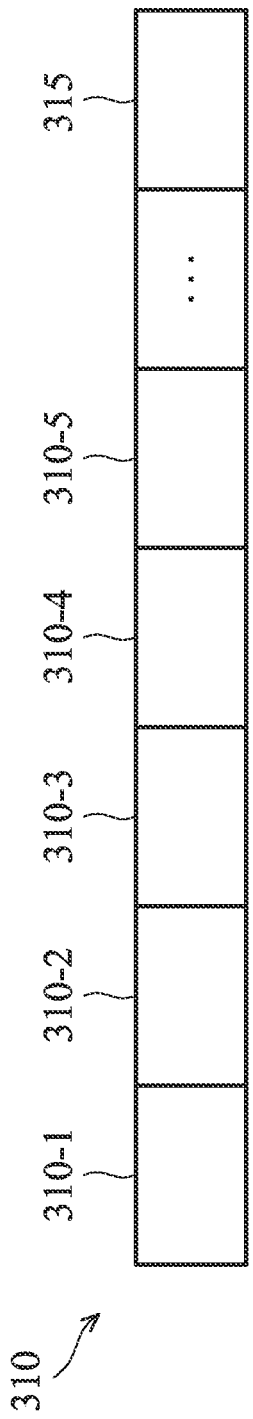
FIGS. 3A~3D are diagrams illustrating an incoming packet with different lengths in accordance with an embodiment of the invention.

FIG. 3A is a diagram of a packet 310 received by the destination device 140 in accordance with an embodiment of the invention. The packet 310 may include packet segments 310-1 through 310-N (referred to herein individually as "packet segment 310" and collectively as "packet segments 310"), where each packet segment has a size equal to the data path width (e.g. 64 bits), and a packet remainder (i.e. end of packet (EOP)) 315, which has a size less than the data path width. For one having ordinary skill in the art, it should be appreciated that when the bus width is N bytes, the packet remainder may have a size from 0 to N−1 bytes.

In an embodiment, the packet buffer 148 may receive the incoming packet and store the incoming packet while the segments of the packet are being processed by the CRC circuits 143. The packet buffer 148 may provide each of the packet segments 310 to the associated CRC circuits 143 per transmission cycle. The controller 141 may also determine the length of the packet remainder 315 and append zeros to the packet remainder 315 to generate a zero-appended packet remainder of a size corresponding to the data path width, e.g. 64 bits. For example, if the size of the packet remainder 315 is N bytes and the data path width is W bytes, the controller 141 may append (W-N) bytes to the packet remainder 315 in the packet buffer 148. For example, if the size of the incoming packet is 64 bytes and the data path width is 64 bits, it may take 8 cycles to acquire the content of the incoming packet. However, the length of the packet remainder may vary from 0 to 7 bytes (i.e. 0~56 bits), and it may take an extra transmission cycle (i.e. the ninth transmission cycle) when the length of the packet remainder is not equal to zero. Furthermore, when the packet buffer 148 receives the packet remainder of the incoming packet, the controller 141 may determine the length of the packet remainder which is denoted as EMOD in the following embodiments. The details can be referred to in the embodiments of FIGS. 3B, 3C and 3D described in the next section.

Figure 3B:
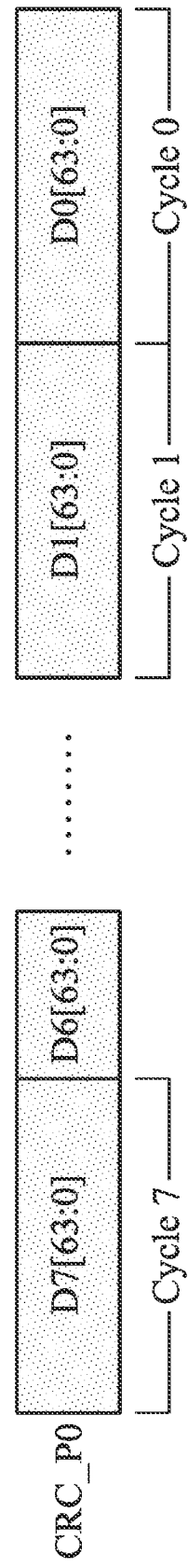
Figure 3C:
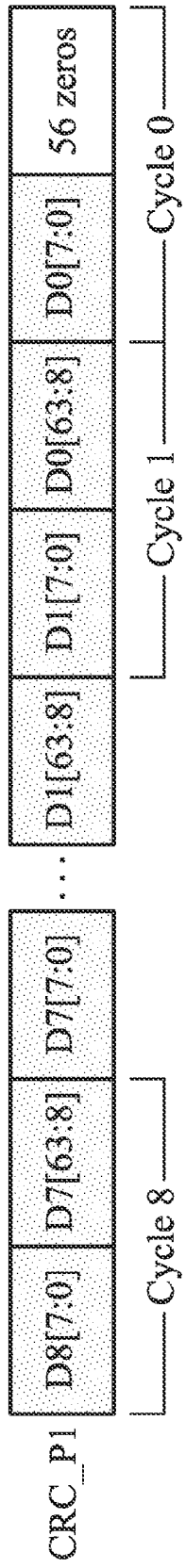
Figure 3D:
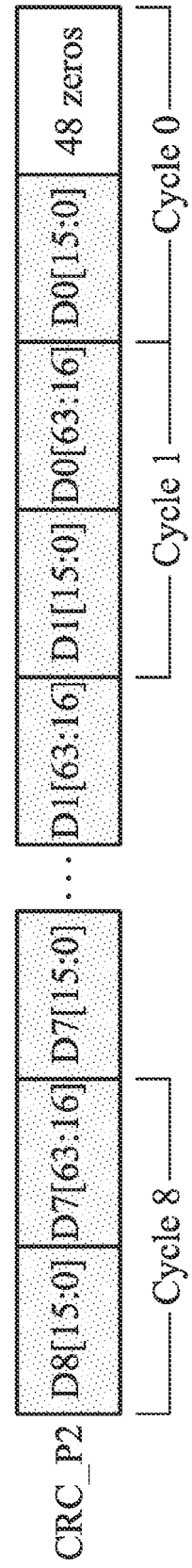

FIGS. 3B~3D are diagrams illustrating incoming packets with different lengths in accordance with an embodiment of the invention. In the embodiments of FIGS. 3B, 3C and 3D, the data path width is 64 bits. As shown in FIG. 3B, the length of an incoming packet is 64 bytes, and the incoming packet can be evenly divisible by the data path width. For example, the 64-byte packet can be divided into 8 packet segments such as D0~D7, and each packet segment has 64-bit data. During transmission of the 64-byte incoming packet, the packet segment having data with LSB is received first (e.g. D0). However, as shown in FIGS. 3C and 3D, the lengths of incoming packets are 65 bytes and 66 bytes, respectively. Regarding a packet having a length which cannot be evenly divisible by the data path width, the controller 141 may append zeros to the packet remainder 315. In FIG. 3C, the length of the packet remainder 315 is 8 bits, and the controller 141 may append 56 zeros to the packet remainder 315. The length of the packet remainder 315 in FIG. 3D is 16 bits, and the controller 141 may append 48 zeros to the packet remainder 315. After appending zeros to the packet remainder 315, the appended packet remainder 315 may fit the data path width. It should be noted that the length of the incoming packet may vary from 64 to 71 bytes in the embodiment and FIGS. 3B~3D only show the zero-appending behaviors for the packets having a length of 64 bytes, 65 bytes and 66 bytes. For one having ordinary skill in the art, it is appreciated that the zero-appending behavior for the packets having different length can be derived based on the aforementioned embodiment.

Figure 3E:
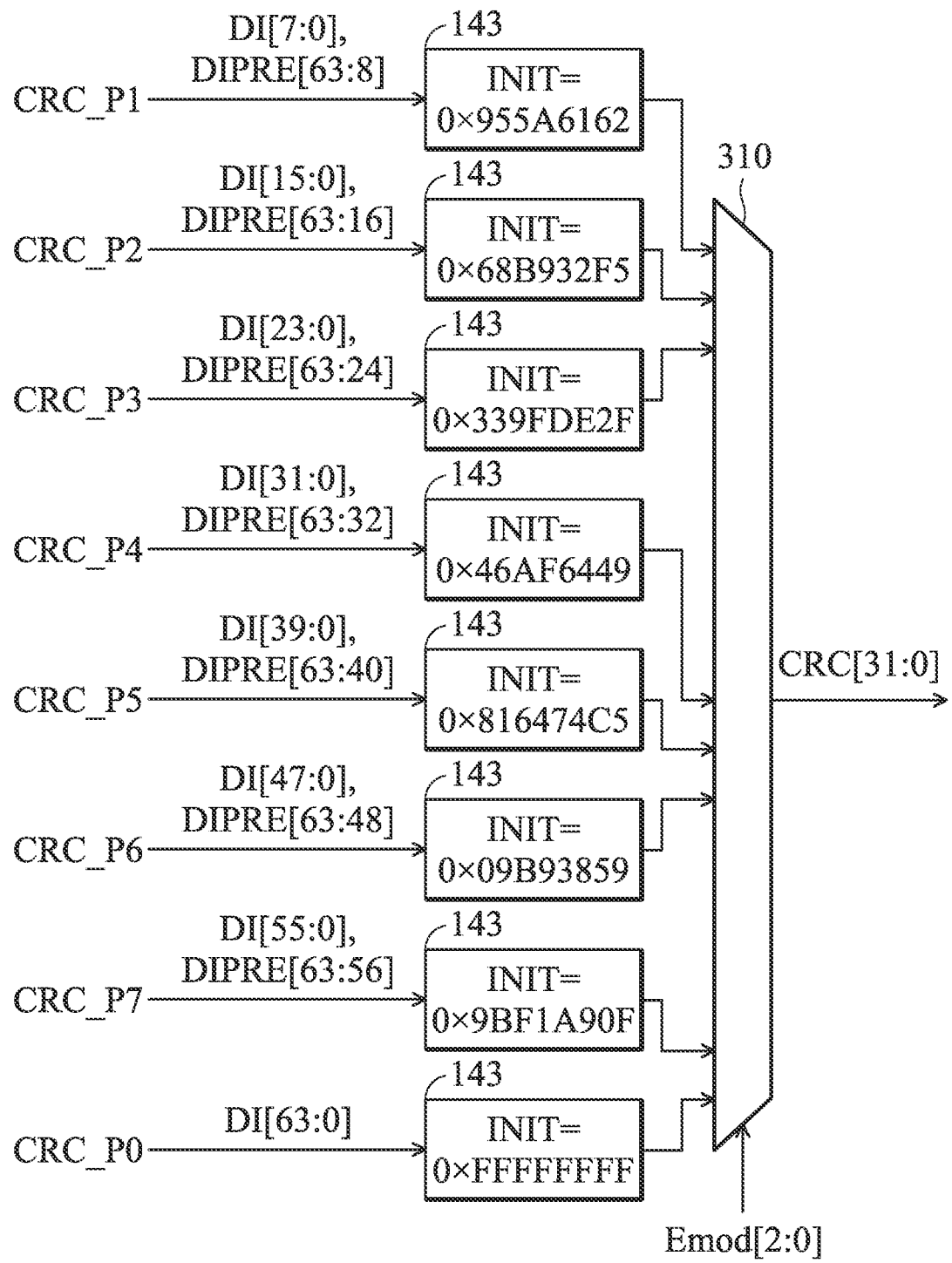
FIG. 3E is a diagram illustrating each CRC circuit being assigned with different initial value and input data in accordance with an embodiment of the invention.

FIG. 3E is a diagram illustrating each CRC circuit being assigned with different initial value and input data in accordance with an embodiment of the invention. Since the length of the packet remainder (i.e. end of packet, EOP) may be from 0 byte to 7 bytes, the CRC value for different lengths of the packet remainder (e.g. 0~7 bytes) should be computed by the destination device 140 to select one of the computed CRC value as the final CRC result.

Referring to FIG. 3E, there are eight phases for the CRC calculation such as CRC_P0, CRC_P1, CRC_P2, CRC_P3, CRC_P4, CRC_P5, CRC_P6, and CRC_P7. In the embodiment, DI denotes the current packet segment, and DIPRE denotes the previous packet segment, where the current packet segment and the previous packet segment are adjacent to each other in the incoming packet. In addition, the current packet segment has data with higher MSB, and the previous packet segment has data with lower MSB. In the phase CRC_P0, the associated CRC circuit 143 is fed with data DI[63:0] and an initial value of 0xFFFFFFFF in the hexadecimal format. In the phase CRC_P1, the associated CRC circuit 143 is fed with data DI[7:0] and DIPRE[63:8], and an initial value of 0x955A6162 in the hexadecimal format. Similarly, in the phase CRC_P2, the associated CRC circuit 143 is fed with data DI[15:0] and DIPRE[63:16], and an initial value of 0x68B932F5 in the hexadecimal format. In a similar way, the length of the DI portion may increase by 1 byte and the length of the DIPRE portion may decrease by 1 byte gradually during each phase change (e.g. CRC_P1 to CRC_P1 to CRC_P2, CRC_P2 to CRC_P3, etc.). It should be noted that each CRC circuit 143 is fed with an individual initial value. For example, the previous packet segment DIPRE are initialized with zeros at the very first transmission cycle of the incoming packet. The current packet segment DI are latched in the packet buffer 148 (i.e. latched by segments every transmission cycle), and the previous packet segment DIPRE can be assigned with the current packet segment DI after the last transmission cycle of the current packet segment DI of the incoming packet.

It should be noted that the initial value may be set to a value of all 1's (e.g. 0xFFFFFFFF). The calculation for the initial values for each CRC phase can be derived by the following C codes:

```
crc_init_r = 0xFFFFFFFF;
for (i = 0; i<N; i=i+1)
{
  if (crc_init_r & 0x1)
    crc_init_r = (crc_init_r ^ 0x04C11DB7) >> 1|0x80000000;
  else
    crc_init_r = (crc_init_r >> 1) & 0x7FFFFFFF;
}
``` where N denotes the number of the CRC phase. It should be noted that the aforementioned initial values for each CRC phase are calculated based on the 32-bit IEEE CRC polynomial. For one having ordinary skill in the art, it is appreciated that the calculation of a 32-bit CRC is well-known and thus the details will be omitted here.

In this embodiment, the final CRC result CRC[31:0] is chosen by a multiplexer 310 controlled by a 3-byte control signal EMOD[2:0]. The value of EMOD associates with the length of the packet remainder 315. For example, when the length of the incoming packet is 64 bytes, the length of the incoming packet can be evenly divisible by the data path width (e.g. 64 bits). Accordingly, the length of the packet remainder is zero, and thus the value of EMOD is 0. When the length of the incoming packet is 65 bytes, the length of the packet remainder of the packet is 1, and thus the value of EMOD is 1. Thus, it will be appreciated that the length of the incoming packet may vary from 64 to 71, and the value of EMOD may vary from 0 to 7. When the value of EMOD is 0, phase CRC_P0 is selected, and the final CRC result will be the output of the phase CRC_P0. Similarly, when the value of EMOD varies from 0~7, the output of the associated phase CRC_P0~CRC_P7 will be selected. In other words, the selected CRC output value is the CRC value of the entire packet. It should be noted that the length of the incoming packet and the data path width are for description, and the invention is not limited thereto.

Figure 4:
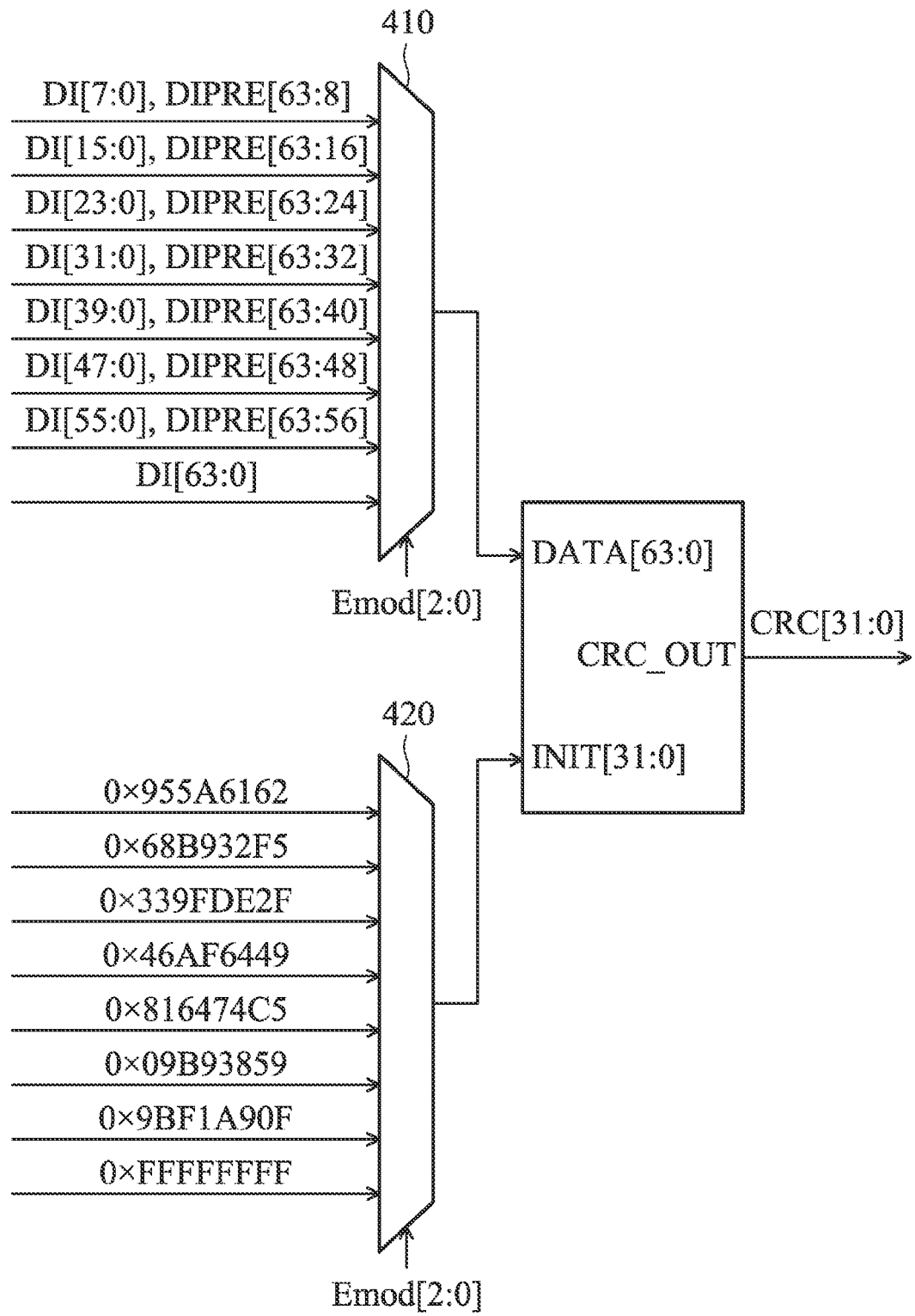
FIG. 4 is a block diagram of the destination device in accordance with another embodiment of the invention.

FIG. 4 is a block diagram of the destination device 140 in accordance with another embodiment of the invention. In this embodiment, the value EMOD can be retrieved at the first transmission cycle of the incoming packet in some situations such as an egress path or packet modification (PMOD) without changing packet length in a transmission (Tx) terminal. Accordingly, the CRC computation can be simplified since the length of the incoming packet is fixed, resulting in a fixed value of EMOD. Thus, only one CRC circuit 143 is deployed in the destination device 140. As shown in FIG. 4, different configurations of input data from the phases CRC_P0~CRC_P7 (shown in FIG. 3B) are fed into the multiplexer 410, and different initial values associated with the phases CRC_P0~CRC_P7 (shown in FIG. 3B) are fed into the multiplexer 420. Since the value of the EMOD is fixed in the embodiment, a specific configuration of input data and initial value are selected, and the CRC circuit 143 may compute the final CRC result CRC[31:0] by using the selected input data and initial value. Accordingly, hardware cost for implementing multiple CRC circuits can be significantly reduced in the embodiment.

Figure 5:
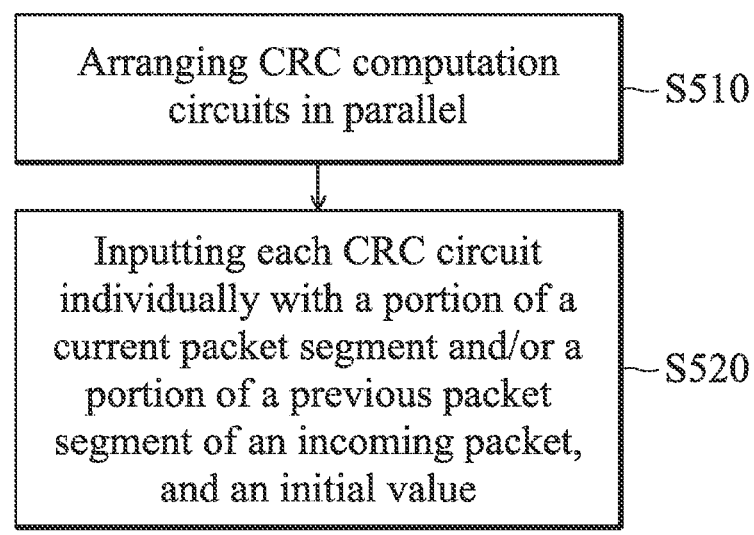
FIG. 5 is a flow chart illustrating a method for generating a CRC value in accordance with an embodiment of the invention.

FIG. 5 is a flow chart illustrating a method for generating a CRC value in accordance with an embodiment of the invention. In step S510, the CRC circuits 143 are arranged in parallel. For example, each of the CRC circuit is a fixed-length (e.g. 64-bit) CRC circuit having a 64-bit input and 32-bit output CRC value. In step S520, each CRC circuit is individually inputted with a portion of a current packet segment and/or a portion of a previous packet segment of an incoming packet, and an initial value.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication device, comprising:
   a controller;
   a packet buffer, configured to store a current packet segment and a previous packet segment of an incoming packet; and
   a plurality of cyclic redundancy check (CRC) circuits,
   wherein one of the CRC circuits simultaneously receives the current packet segment and a first initial value, and each of the remaining CRC circuits of the CRC circuits simultaneously receives a portion of the current packet segment, a portion of a previous packet segment, and a second initial value,
   wherein the second initial values of the remaining CRC circuits are different from each other, the current packet segment portions received by the remaining CRC circuits are different from each other, and the previous packet segment portions received by the remaining CRC circuits are different from each other,
   wherein the plurality of CRC circuits are arranged in parallel, and the one of the CRC circuits computes a first CRC value based on the received first initial value and the current packet segment, and each CRC circuit of the remaining CRC circuits computes a second CRC value based on the received second initial value, the received portion of the current packet segment, and the received portion of the previous packet segment,
   wherein one of the first CRC value generated by the one of the CRC circuits and the second CRC values generated by the remaining CRC circuits is selected as a resulting CRC value according to a selection signal determined by the controller.

2. The communication device as claimed in claim 1, wherein each current packet segment and each previous packet segment have a size corresponding to a data path width of the communication device.

3. The communication device as claimed in claim 1, wherein each CRC circuit is implemented by a fixed-length CRC circuit.

4. The communication device as claimed in claim 2, wherein the controller determines a packet remainder of the incoming packet based on the data path width associated with the communication device, and appends zeros to the packet remainder to fit the data path width when the length of the packet remainder is not zero.

5. The communication device as claimed in claim 4, wherein the selection signal associates with the length of the packet remainder of the incoming packet.

6. The communication device as claimed in claim 4, wherein the first initial value and the second initial values are computed and stored in a non-volatile memory of the communication device based on a CRC-32 polynomial and the length of the packet remainder.

7. The communication device as claimed in claim 1, wherein the previous packet segment is initialized with zeros at the first transmission cycle of the incoming packet.

8. A method for generating a cyclic redundancy check (CRC) value for use in a communication device, wherein the communication device comprises a plurality of CRC circuits, the method comprising:
   arranging the plurality of CRC circuits in parallel;
   simultaneously inputting one of the CRC circuits with a current packet segment, and a first initial value; and
   simultaneously inputting each of the remaining CRC circuits in the CRC circuits with a portion of the current packet segment, a portion of a previous packet segment, and a second initial value,
   wherein the one of the CRC circuits computes a first CRC value based on the received first initial value and the current packet segment, and each CRC circuit of the remaining CRC circuits computes a second CRC value based on the received second initial value, the received portion of the current packet segment, and the received portion of the previous packet segment,
   wherein the second initial values of the remaining CRC circuits are different from each other, the current packet segment portions received by the remaining CRC circuits are different from each other, and the previous packet segment portions received by the remaining CRC circuits are different from each other,
   wherein one of the first CRC value generated by the one of the CRC circuits and the second CRC values generated by the remaining CRC circuits is selected as a resulting CRC value according to a selection signal.

9. The method as claimed in claim 8, wherein each current packet segment and each previous packet segment have a size corresponding to a data path width of the communication device.

10. The method as claimed in claim 9, wherein the previous packet segment is initialized with zeros at the first transmission cycle of the incoming packet.

11. The method as claimed in claim 9, further comprising:
   determining a packet remainder of the incoming packet based on the data path width associated with the communication device; and
   appending zeros to the packet remainder to fit the data path width when the length of the packet remainder is not zero.

12. The method as claimed in claim 11, wherein the selection signal associates with the length of the packet remainder of the incoming packet.

13. The method as claimed in claim 11, further comprising:
   computing the first initial value and the second initial values are based on a CRC-32 polynomial and the associated length of the packet remainder.

14. The method as claimed in claim 8, wherein each CRC circuit is implemented by a fixed-length CRC circuit.

* * * * *